US012648082B2

(12) United States Patent
Engel

(10) Patent No.: US 12,648,082 B2
(45) Date of Patent: Jun. 2, 2026

(54) CIRCUIT BOARD HAVING AN EDGE CONTAINING CONDUCTIVE REGIONS

(71) Applicant: Teradyne, Inc., North Reading, MA (US)

(72) Inventor: Daniel L. Engel, Salem, OR (US)

(73) Assignee: Teradyne, Inc., North Reading, MA (US)

( * ) Notice: Subject to any disclaimer, the term of this patent is extended or adjusted under 35 U.S.C. 154(b) by 301 days.

(21) Appl. No.: 18/233,777

(22) Filed: Aug. 14, 2023

(65) Prior Publication Data

US 2025/0063664 A1     Feb. 20, 2025

(51) Int. Cl.
| | |
|---|---|
| *H05K 1/14* | (2006.01) |
| *G01R 31/28* | (2006.01) |
| *H05K 1/11* | (2006.01) |
| *H05K 3/02* | (2006.01) |
| *H05K 3/04* | (2006.01) |
| *H05K 3/06* | (2006.01) |

(52) U.S. Cl.
CPC .......... *H05K 1/14* (2013.01); *G01R 31/2832* (2013.01); *H05K 1/117* (2013.01); *H05K 1/142* (2013.01); *H05K 3/027* (2013.01); *H05K 3/043* (2013.01); *H05K 3/06* (2013.01); *H05K 2201/041* (2013.01); *H05K 2201/09063* (2013.01); *H05K 2201/09154* (2013.01); *H05K 2201/09272* (2013.01); *H05K 2201/094* (2013.01); *H05K 2201/10378* (2013.01)

(58) Field of Classification Search
CPC .......... H05K 1/14; H05K 1/117; H05K 1/142; H05K 3/027; H05K 3/043; G01R 31/2832
USPC ......................................... 361/748
See application file for complete search history.

(56) References Cited

U.S. PATENT DOCUMENTS

| | | | |
|---|---|---|---|
| 9,435,855 B2 | 9/2016 | Lewinnek et al. | |
| 9,594,114 B2 | 3/2017 | Sinsheimer | |
| 9,786,977 B2 | 10/2017 | Lyons et al. | |
| 10,264,664 B1 * | 4/2019 | Vinciarelli | H05K 3/0026 |
| 10,451,652 B2 | 10/2019 | Sinsheimer et al. | |
| 11,604,219 B2 | 3/2023 | Sinsheimer et al. | |
| 11,605,695 B2 * | 3/2023 | Kim | H10K 59/131 |
| 11,614,663 B2 * | 3/2023 | Jang | G02F 1/1339 |
| | | | 361/768 |
| 11,747,685 B2 * | 9/2023 | Lee | G02F 1/136286 |
| | | | 349/42 |
| 11,855,376 B2 | 12/2023 | Sinsheimer | |
| 2020/0266138 A1 * | 8/2020 | Hong | H01L 23/49822 |

* cited by examiner

*Primary Examiner* — Binh B Tran
(74) *Attorney, Agent, or Firm* — ARENTFOX SCHIFF LLP

(57) ABSTRACT

An example apparatus includes a circuit board. The circuit board includes one or more layers that form first electrically conductive regions and electrically non-conductive regions; an edge at an angle relative to the one or more layers; and second electrically conductive regions on the edge that are electrically connected to one or more of the first electrically conductive regions. The second electrically conductive regions are substantially flat and each has a connection surface that is substantially parallel to a surface of the edge.

20 Claims, 18 Drawing Sheets

302

102
809
101

100

809    802    809

807

130

120

900

906

901

950

907

1030

120

100

1130

100

CIRCUIT BOARD HAVING AN EDGE CONTAINING CONDUCTIVE REGIONS

TECHNICAL FIELD

This specification describes example implementations of circuit boards having one or more edges containing conductive regions.

BACKGROUND

A typical example circuit board includes multiple electrically conductive layers separated by dielectric layers. The electrically conductive layers form electrical circuits and/or traces within the circuit board. Electrical connections to the circuit board have traditionally been made through conductive pads on the primary or secondary faces of the circuit board, which are alternatively known as the top, bottom, component, and/or solder sides of the circuit board. The primary and secondary faces typically represent the largest parallel faces of the circuit board with the other layers in parallel between.

SUMMARY

An example apparatus includes a circuit board. The circuit board includes one or more layers that form first electrically conductive regions and electrically non-conductive regions; an edge at an angle relative to the one or more layers; and second electrically conductive regions on the edge that are electrically connected to one or more of the first electrically conductive regions. The second electrically conductive regions are substantially flat and each has a connection surface that is substantially parallel to a surface of the edge. The apparatus may include one or more of the following features, either alone or in combination.

The edge may be at a right angle relative to the one or more layers or at an oblique angle relative to the one or more layers. The second electrically conductive regions may be or include remnants of an original larger electrically conductive region.

The apparatus may include a filling or a coating that includes a protective substance among the second electrically conductive regions. The circuit board may be, or be part of, a test instrument or a subassembly of the test instrument.

A device may be electrically connected to the second electrically conductive regions. The device may be, include, or be part of an interposer. The interposer may be for translating a pitch of signal paths between the second electrically conductive regions and another device connected to the interposer.

The circuit board may be a first circuit board and the device may be or include a second circuit board. The device may include a connector assembly. The connector assembly may be configured to connect electrically to a mating connector assembly.

An example method includes fabricating a circuit board having an edge plated with electrically conductive material. The method includes mounting the circuit board to enable a tool to access the edge; and controlling the tool to execute a path to remove some of the electrically conductive material from the edge to form electrically conductive regions on the edge. The electrically conductive regions may be electrically isolated from each other on the edge. The electrically conductive regions may be substantially flat and each may have a connection surface that is within a substantially same plane. The method may include one or more of the following features, either alone or in combination.

The tool may be or include a computer numerical controlled (CNC) milling machine that rotates a structure to remove at least some of the electrically conductive material from the edge gradually. The CNC milling machine may be configured to remove additional electrically conductive plating from the edge to form at least one mechanical alignment registration feature. The tool may be or include a laser that applies a laser beam to at least some of the electrically conductive material on the edge. The laser beam ablates at least some of the electrically conductive material.

The circuit board may be, include, or be part of a test instrument. The test instrument may be for sending test signals to a device under test (DUT) and for analyzing responses from the DUT. The method may also include coupling the circuit board to a device interface board (DIB), where the DIB includes a contact that electrically connects to the DUT; sending the test signals from the circuit board to the DUT via the electrically conductive regions; and receiving, at the circuit board, the responses from the DUT via the electrically conductive regions. The method may also include connecting an interposer between the circuit board and the DIB. The interposer provides mechanical compliance between the electrically conductive regions and the DIB. The circuit board may be coupled to the DIB at an oblique angle or a right angle.

An example method includes fabricating a circuit board having an edge plated with electrically conductive material. The method includes mounting a circuit board to enable chemical etching of the edge; and performing chemical etching on the edge to remove some of the electrically conductive material from the edge to form electrically conductive regions on the edge. The electrically conductive regions may be electrically isolated from each other on the edge. The electrically conductive regions may be substantially flat and each may have a connection surface that is within a substantially same plane.

An example system includes a first circuit board and a second circuit board, with the first circuit board having first electrically conductive regions. The second circuit board includes one or more layers that form second electrically conductive regions and electrically non-conductive regions, and an edge at an angle relative to the one or more layers. The second circuit board also includes third electrically conductive regions on the edge. The third electrically conductive regions are substantially flat and each has a connection surface that is substantially parallel to a surface of the edge. The third electrically conductive regions are electrically connected to the first electrically conductive regions and to the second electrically conductive regions. The first circuit board and the second circuit board are physically coupled to each other. The second circuit board may be at an oblique angle or a right angle relative to the first circuit board. The example system may include one or more of the following features, either alone or in combination.

The second circuit board may be at angle of between 45° and 90° inclusive relative to the first circuit board. The system may include an interposer between the first circuit board and the second circuit board. The interposer may physically couple the first circuit board and the second board.

The first circuit board may be, include, or be part of DIB. The DIB may include a slot for holding a DUT. The system may also include a test instrument that includes the second circuit board. The test instrument may be configured to perform the following operations: sending the test signals to the DUT via the third electrically conductive regions; receiving the responses from the DUT via the third electrically conductive regions; and analyzing the responses to determine whether the DUT passed or failed testing.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations. The devices, test systems, and processes described in this specification may be configured, for example, through design, construction, formulation, arrangement, placement, programming, operation, activation, deactivation, and/or control.

The details of one or more implementations are set forth in the accompanying drawings and the following description. Other features and advantages will be apparent from the description and drawings and claims.

DESCRIPTION OF THE DRAWINGS

Like reference numerals in different Figures indicate like elements.

DETAILED DESCRIPTION

Described herein are examples of circuit boards having more than one electrically conductive region across one or more circuit board edges. In some implementations, an edge of a circuit board includes any flat or curved surface that intersects one or more parallel layers included in the circuit board. The edge may be at a right angle (90°) or an oblique angle (0° to 90° exclusive) relative to the one or more parallel layers. The electrically conductive regions are configured and arranged to provide connection surfaces that are parallel with one or more of the edge surfaces.

The electrically conductive regions enable the circuit board to electrically connect to another structure, such as another circuit board, through the edge of the circuit board. For example, the circuit board may be part of a set of circuit boards electrically connected to a backplane perpendicularly.

Electrical connections made via electrically conductive regions on the edge of the circuit board may have advantages. For example, such connections may reduce the need for cable assemblies, which can be cumbersome to implement in small spaces. Furthermore, electrically conductive regions on the edge of the circuit board may reduce the length and/or complexity of electrical connections between two circuit boards. This may be particularly useful for signals having higher frequency transmission components, such as in the Gigahertz range, since such signals may be susceptible to signal loss, degradation, and/or interference during transmission.

Figure 1:
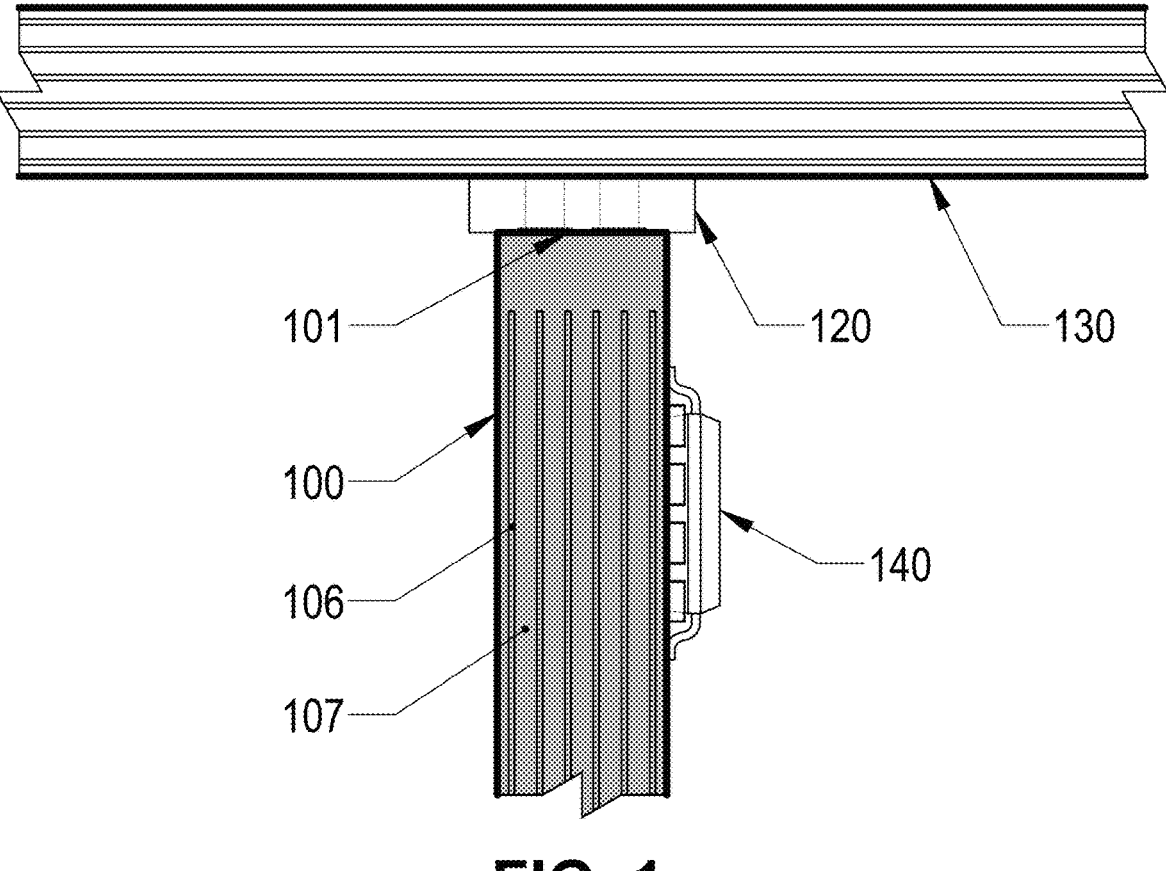
FIG. 1 is a diagram of an example circuit board having electrically conductive regions on its edge connected to an interposer connected to another circuit board having electrically conductive regions on its primary or secondary face.

FIG. 1 is a cross-section diagram of an example circuit board 100 having electrically conductive regions formed on its edge 101. Circuit board 100 is connected to another circuit board 130 via those electrically conductive regions and an interposer 120. In this example, edge 101 of circuit board 100 is perpendicular to one or more parallel layers 106/107 of circuit board 100, resulting in a right angle (90°) connection between the two circuit boards 100 and 130. However, the connection may be made at other angles if the edge is formed at a different angle (described below).

FIG. 1 also shows an example internal construction of circuit board 100, including the parallel electrically conductive layers 106 that may form conductive paths for electrical signals to pass to and from the electrically conductive regions on edge 101. Electrically conductive layers 106 are arranged among electrically non-conductive layers 107, which may be a dielectric such as FR-4. Six electrically conductive layers are shown, but any number of layers may be used.

Figure 2:
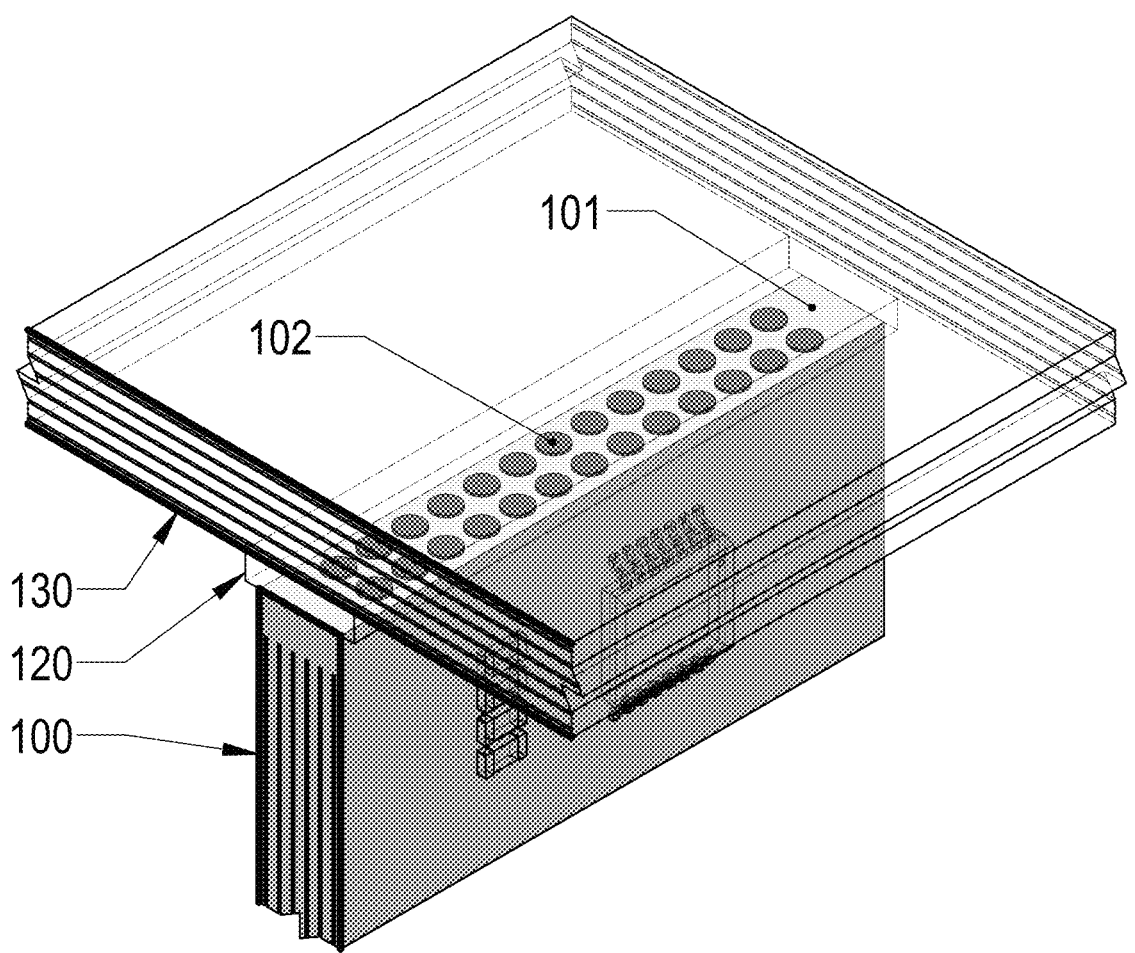
FIG. 2 is a perspective, partially transparent view of the circuit boards of FIG. 1.

FIG. 2 shows a perspective, partially transparent view of elements of example circuit board 100 in FIG. 1. In this view, edge 101 is configured with multiple electrically conductive regions 102. As explained previously, electrically conductive regions 102 have connection surfaces that lie along one or more edge surfaces. Electrically conductive regions 102 may have any appropriate size, shape, and/or location on the edge(s). In this example view, electrically conductive regions 102 are circular.

As shown in FIGS. 1 and 2, interposer 120 may be incorporated between circuit board 100 and circuit board 130. In some implementations, this interposer is used to support a robust electrical connection while compensating for tolerance errors in various manufacturing and assembly steps. The interposer may incorporate features that utilize alignment pins (described below). In some implementations, interposer compliance force may be provided by a reversible mechanism, such as springs or a vacuum pump. In some implementations, the attachment may be fixed, such as with solder. An interposer is not a requirement in any implementation; the connection may be direct.

FIG. 1 also shows circuit components 140, which may reside physically on the surface of circuit board 100 and connect electrically to circuits and traces within circuit board 106 formed by one or more of the parallel electrically conductive layers. Circuitry 140 may include active components such as power supplies or microprocessors and/or passive components such as resistors or capacitors. Circuitry 140 may be configured to condition and/or to process signals sent between circuit boards 100 and 130. The selection and configuration of circuitry may encompass any aspect of typical circuit board design techniques.

Figure 3A:
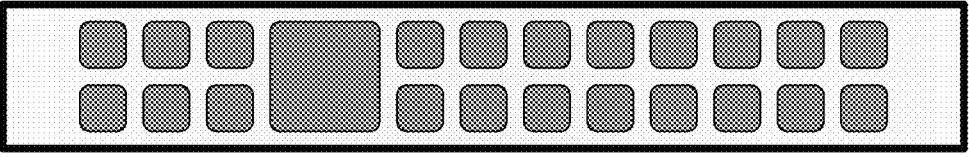
FIGS. 3A, 3B, and 3C are example configurations of electrically conductive regions on an edge of a circuit board.
Figure 3B:
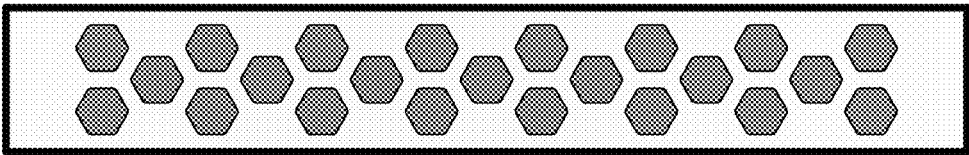
Figure 3C:

FIGS. 3A, 3B, and 3C show additional examples of possible configurations for electrically conductive regions 102. FIG. 3A shows square-shaped conductive regions, which may be simpler to fabricate. FIG. 3B shows hexagonal shaped conductive regions, which may yield higher density connections. FIG. 3C shows additional possible region shapes, including concentric region 302 which may be useful for shielded coaxial signals. When configuring the electrically conductive regions, examples of parameters to consider in determining their sizes, shapes, and/or locations may relate to contact size, impedance matching, shielding, current rating (ampacity), isolation voltages, plating thickness, product assembly tolerances, and/or fabrication tolerances.

FIGS. 4A, 4B, 5A, and 5B show two example ways a circuit board may interconnect electrically conductive regions with parallel conductive layers 106.

Figure 4A:
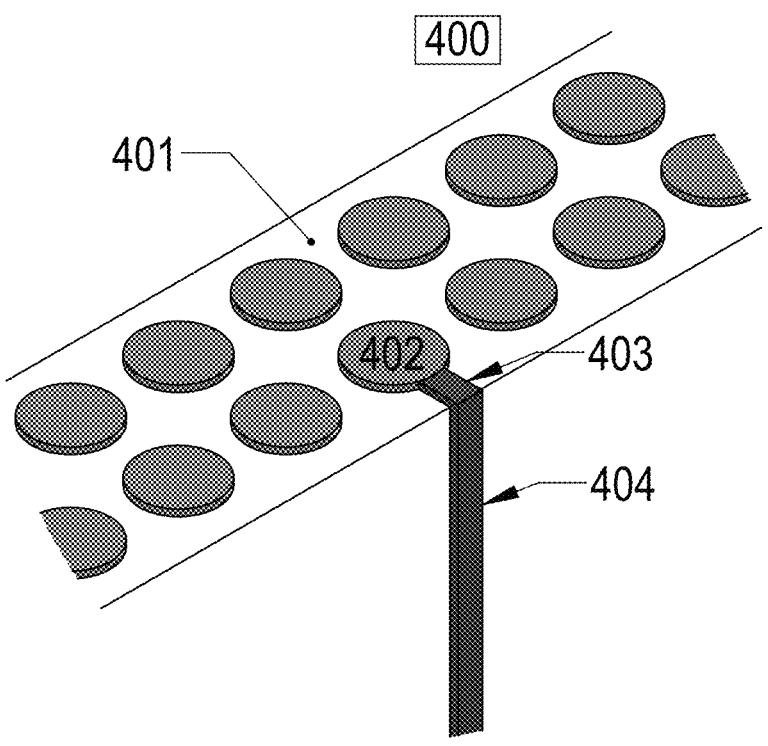
FIGS. 4A and 4B are close-up views of electrically conductive regions that connect to an external layer of a circuit board.
Figure 4B:
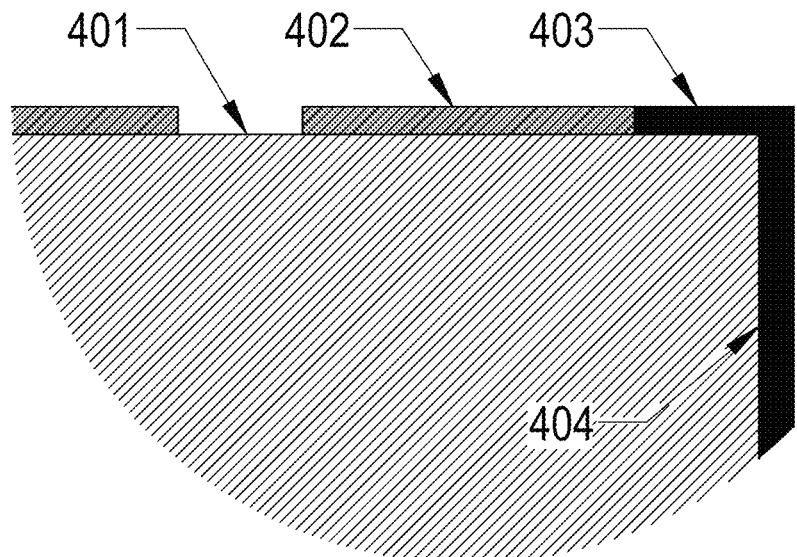

FIGS. 4A and 4B show a connection made to the outer surface of the circuit board (either primary or secondary). Specifically, example conductive trace 404 (formed by circuit board processing techniques) connects to electrically conductive region 402 on edge 401 of circuit board 400 (which may be a variant of circuit board 100 of FIG. 1) through an intermediate conductive region 403 (which is also on edge 401 of circuit board 400). Electrically conductive regions 402 and 403 may be formed in a single step.

Figure 5A:
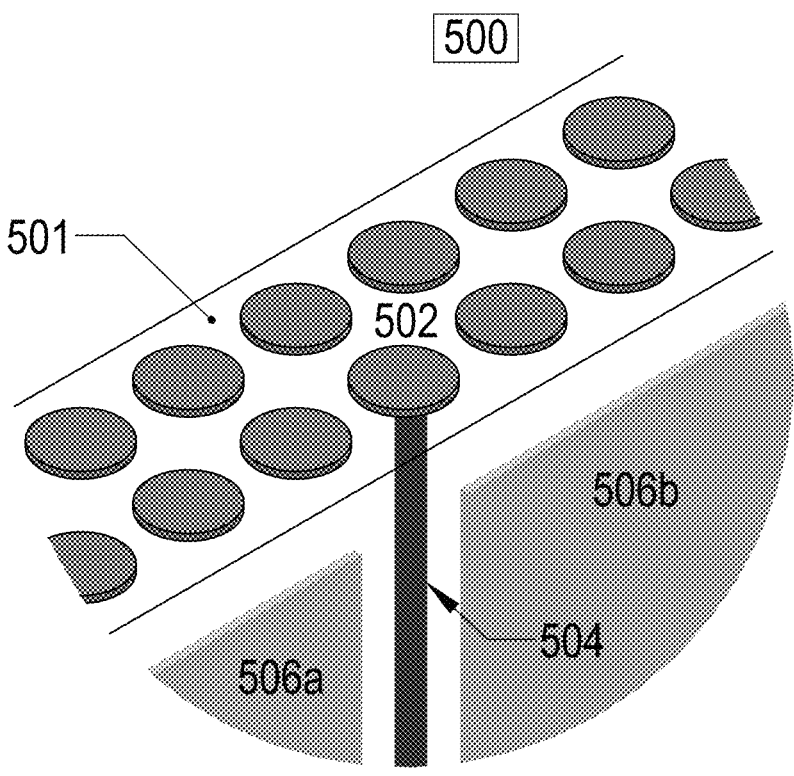
FIGS. 5A and 5B are close-up views of electrically conductive regions that connect to an internal layer of a circuit board.
Figure 5B:
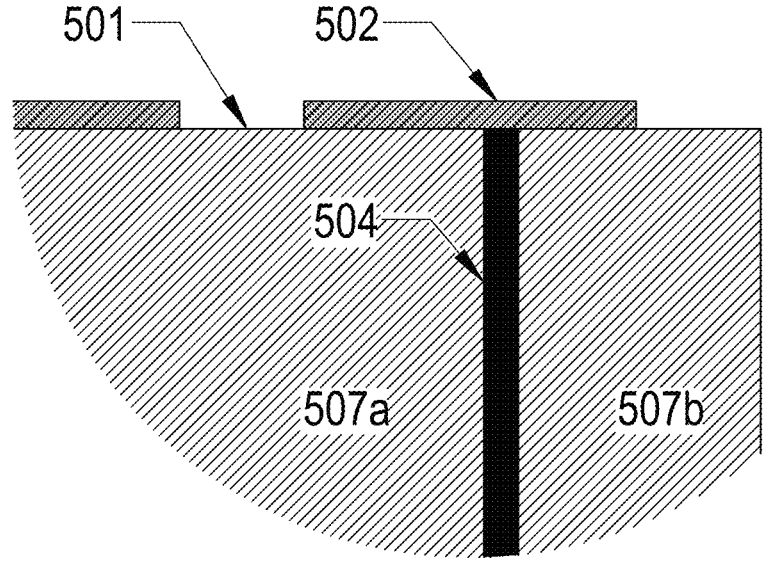

FIGS. 5A and 5B show a connection made to an inner conductive layer of circuit board 100 surrounded on both sides by non-conductive material 507a and 507b. Specifically, example conductive trace 504 may be designed so that it connects directly to electrically conductive region 502 on edge 501 of circuit board 500 (which may be a variant of circuit board 100 of FIG. 1). Additional conductive regions 506a and 506b may also be present on the same inner conductive layer which may or may not be connected to additional electrically conductive regions on edge 101.

Figure 6A:
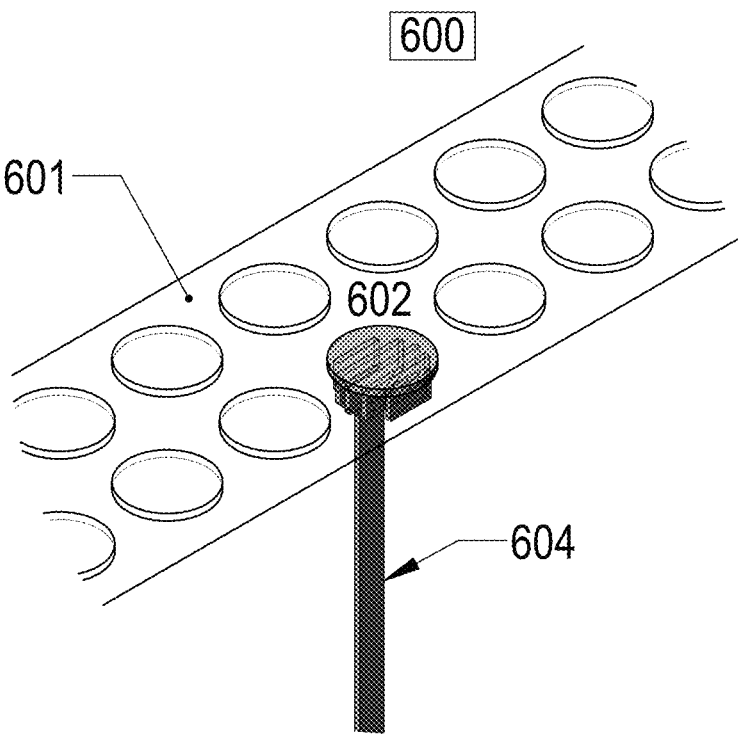
FIGS. 6A and 6B are close-up views of electrically conductive regions that connect to multiple internal layers of a circuit board.
Figure 6B:
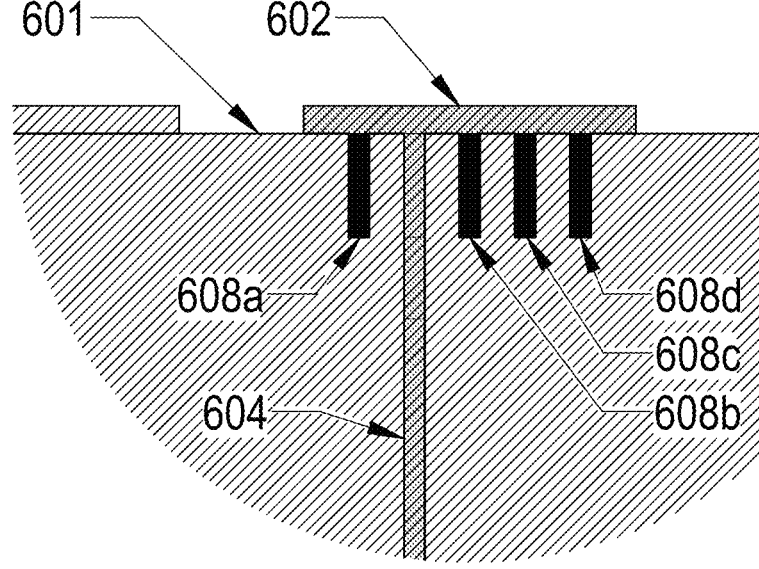

FIGS. 6A and 6B show an example implementation where electrically conductive regions 602 on the edge of circuit board 600 (which may be a variant of circuit board 100 of FIG. 1) connect to more than one conductive layer. Such a configuration may be desirable for various reasons, and may have electrical benefits such as load sharing of high currents and/or mechanical benefits such as increased resistance to peel-off damage. The example shows five separate layer connections to electrically conductive region 602 on edge 601. Of these five connections, one longer connection 604 may provide a connection to other circuitry on the circuit board, while four "stub" connections 608a, 608b, 608c, and 608d provide mechanical structure. Many other configurations are possible.

Figure 7:
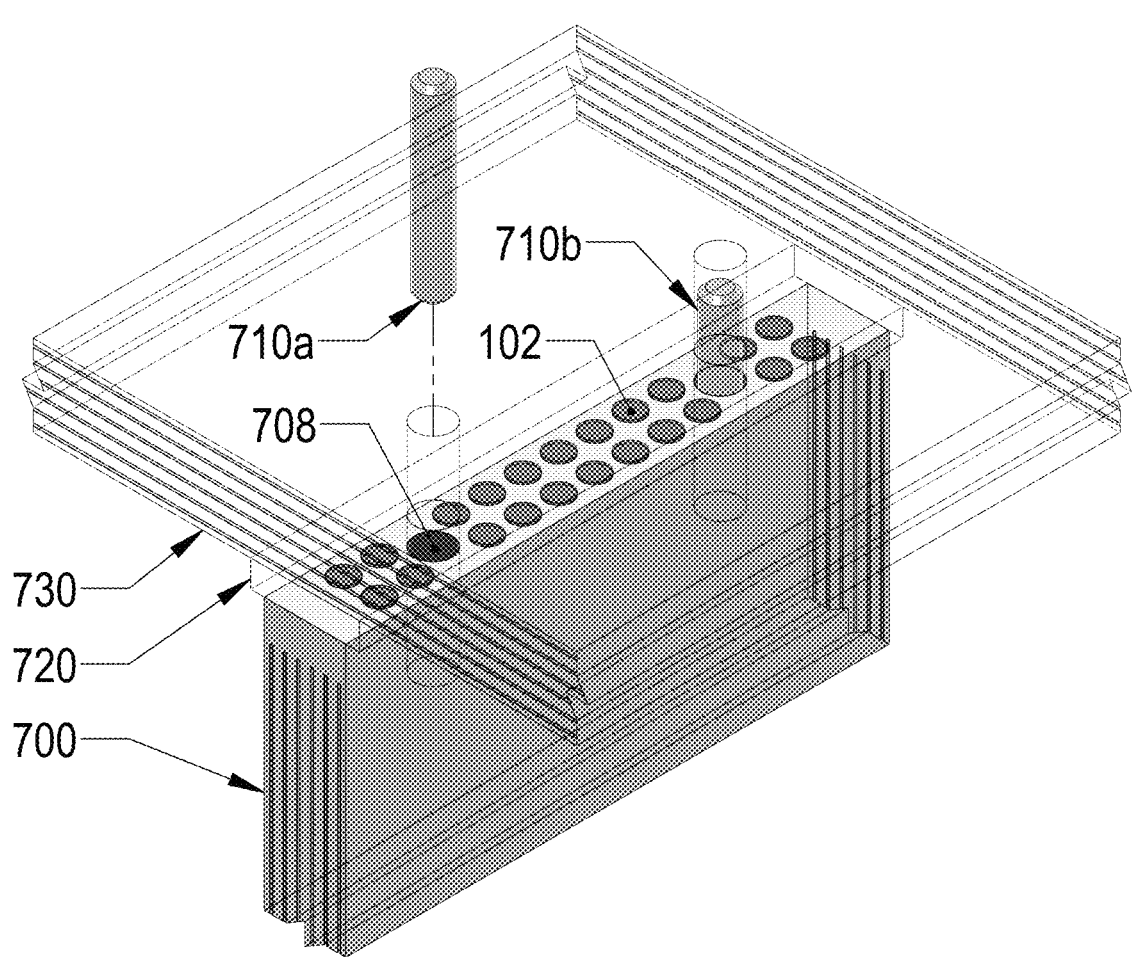
FIG. 7 is a perspective, partially transparent view of a circuit board with integrated alignment features.

FIG. 7 shows how circuit board 700 (which may be a variant of circuit board 100 of FIG. 1), interposer 120, and circuit board 730 (which may be a variant of circuit board 130 of FIG. 1) may incorporate one or more alignment features such as blind hole 708 to help position the electrically conductive regions in an assembly configuration. In this example, alignment pins 710a and 710b control the relative position of the components in two dimensions. Particularly note that circuit board 700 may be designed so that alignment features and the electrically conductive regions may be fabricated in a common manufacturing step, thereby reducing or minimizing tolerance error accumulation. The configuration of alignment features may be symmetrical or asymmetrical depending on the assembly requirements.

Figure 8A:
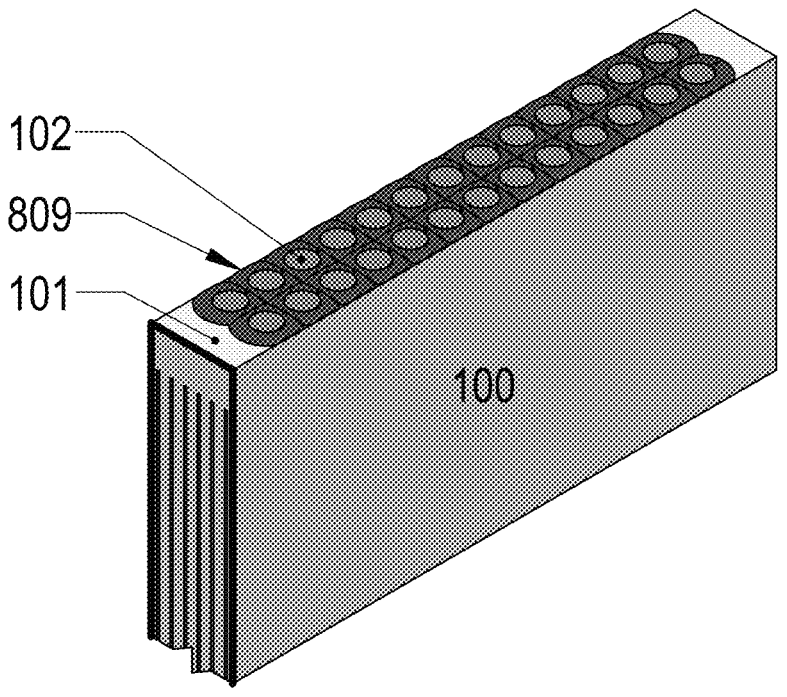
FIGS. 8A and 8B are close-up views of electrically conductive regions surrounded by a protective coating.
Figure 8B:
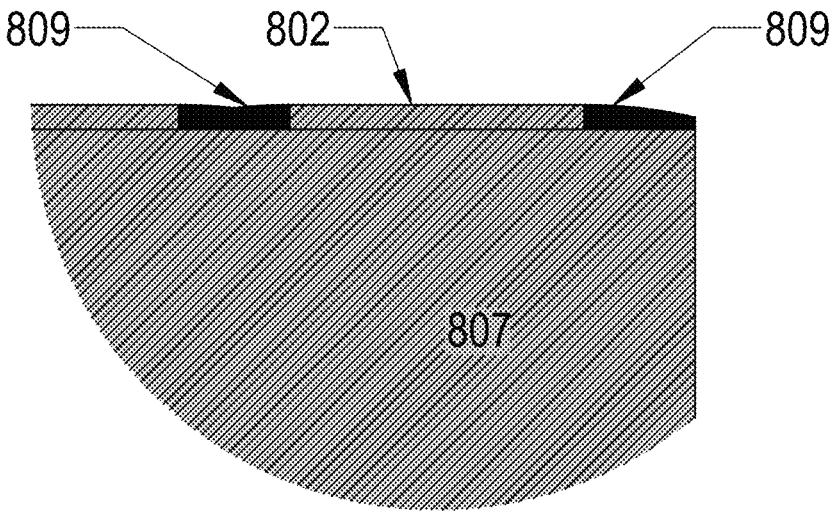

FIGS. 8A and 8B show a filling or a coating 809, such as a polymer or plastic, that may be introduced on the circuit board edge 101 between the electrically conductive regions 102. This filling or coating may be included to protect any exposed electrically non-conductive layers 107 and/or the perimeter of the electrically conductive regions 102. The filling or coating 809 may protect from contaminants like dust or other debris. The filling or coating 809 may also increase the durability of the electrically conductive regions by protecting against mechanical stresses such as peel-off.

Figure 9:
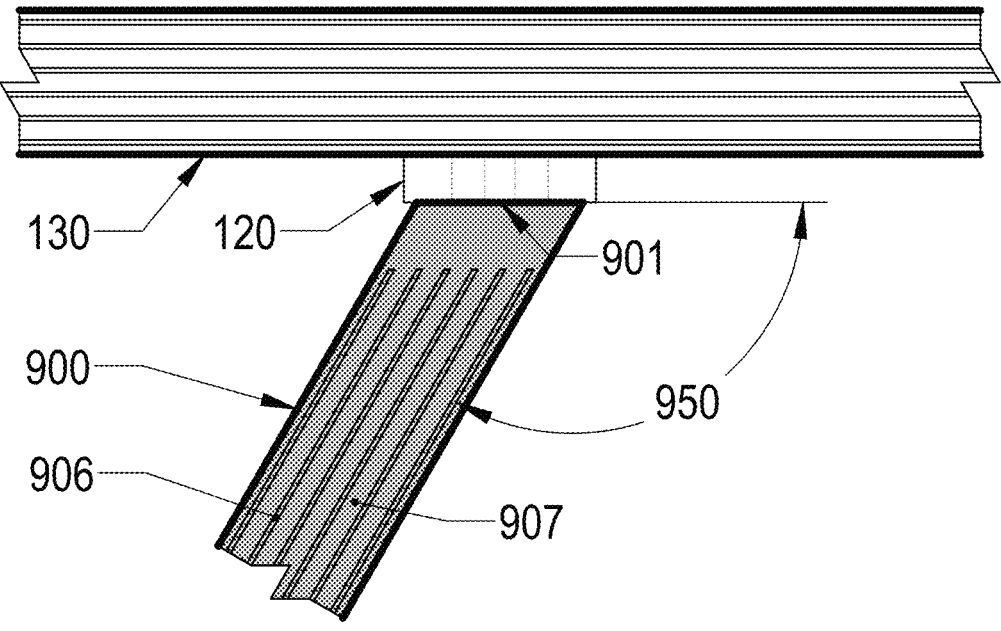
FIG. 9 is a diagram of an example circuit board having electrically conductive regions on its edge at an oblique angle connected to an interposer connected to another circuit board having electrically conductive regions on its primary or secondary face.

As previously indicated, edge 101 may be constructed at different angles relative to the parallel constituent layers 106, 107 of FIG. 1. As shown in FIGS. 1 and 2, edge 101 may be at a right angle relative to the parallel constituent layers. Alternatively, FIG. 9 shows a diagram of example circuit board 900 connected at oblique angle 950 to circuit board 130. In some implementations, circuit board edge 901 will be at an angle between 45° and 135° inclusive relative to the parallel constituent layers 906, 907; however, any angle 0° to 180° exclusive may be used. Parameters that may affect the angle include, but are not limited to, the size of the two circuit boards, the number of circuit boards connected, the locations of the connections, and the like.

Figure 10:
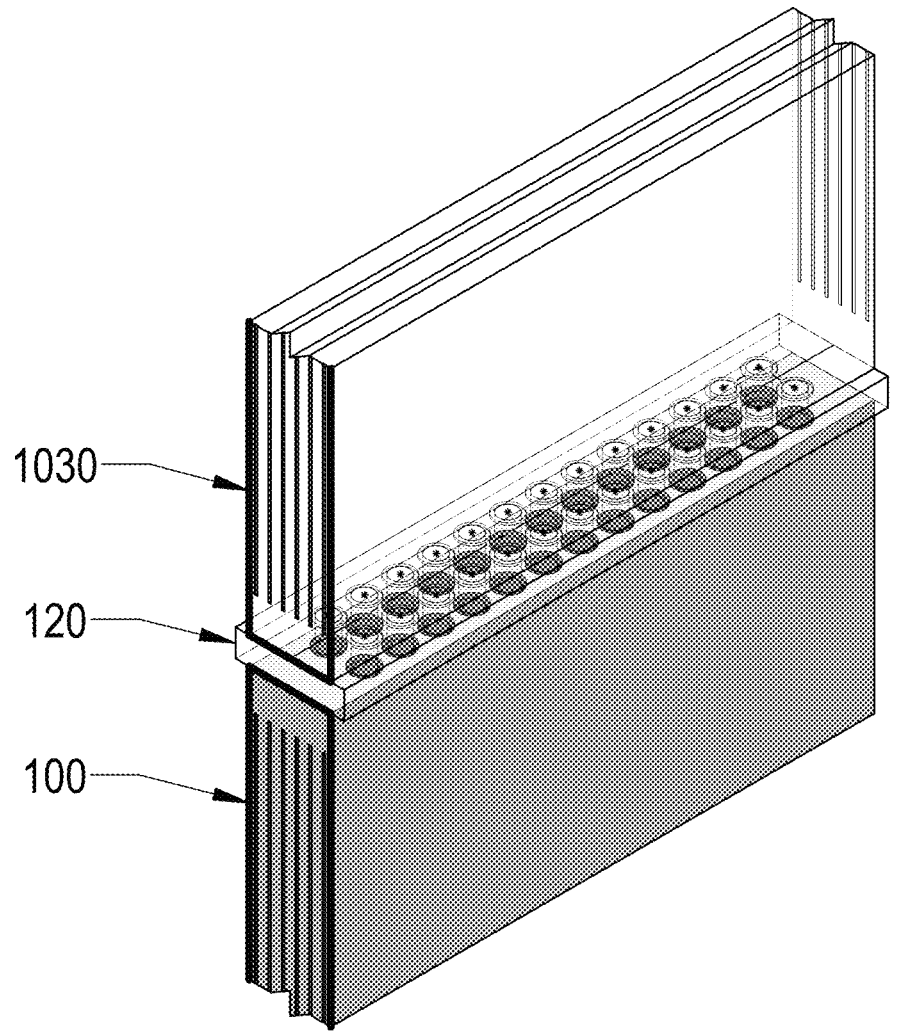
FIG. 10 is a perspective, partially transparent view of two circuit boards connected together via electrically conductive regions on their edges through an interposer.
Figure 11:
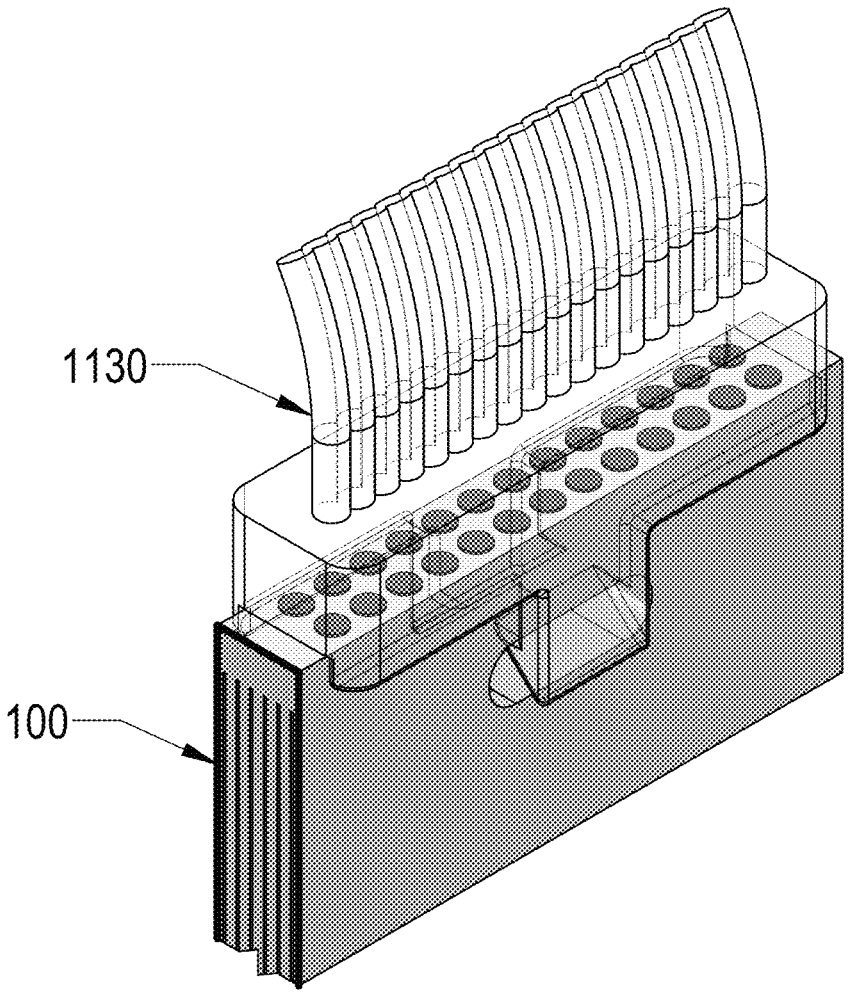
FIG. 11 is a perspective, partially transparent view of a circuit board connected to a cable assembly with electrically conductive regions on its edge.
Figure 12:
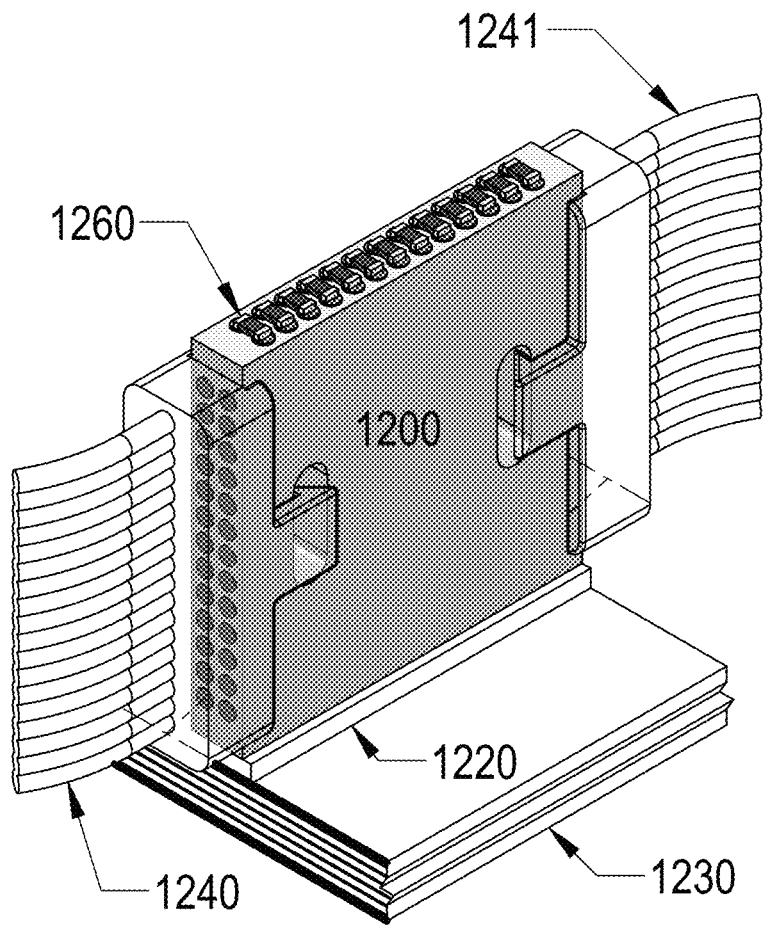
FIG. 12 is a perspective, partially transparent view of a circuit board connected to multiple devices on various edges.

FIGS. 10, 11, and 12 show different configurations of devices that may be electrically and/or mechanically connected to electrically conductive regions on one or more edges of a circuit board. These devices may be or include another circuit board, a cable assembly, circuit components, or any other suitable device. FIG. 10 shows two circuit boards 100 and 1030 connected through electrically conductive regions on their edges through interposer 120. FIG. 11 shows cabled connector assembly 1130 directly connected to electrically conductive regions on the edge of circuit board 100. FIG. 12 shows circuit board 1200 connected to DIB circuit board 1230 through interposer 1220. FIG. 12 also shows circuit board 1200 connected to cabled connector assemblies 1240 and 1241. Finally, FIG. 12 shows circuit components 1260 directly soldered to electrically conductive regions on the edge of circuit board 1200. In general, circuit boards may include electrically conductive region on more than one edge, e.g., on two edges, on three edges, on four edges, or more depending on the shape of the circuit board. The edges so used need not be arranged in any particular relative shape.

Figure 13:
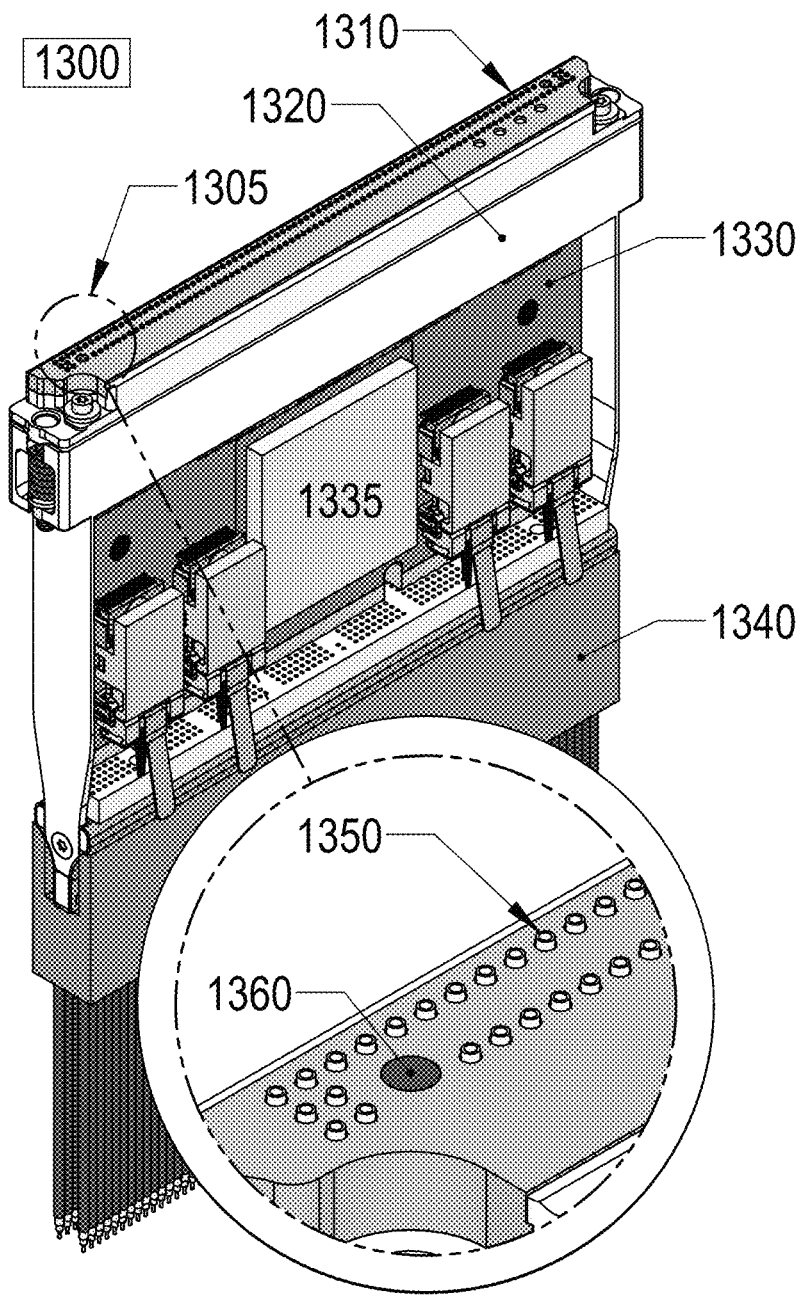
FIG. 13 is a perspective view of an example test system instrument design based on a circuit board having electrically conductive regions on its edge.
Figure 14:
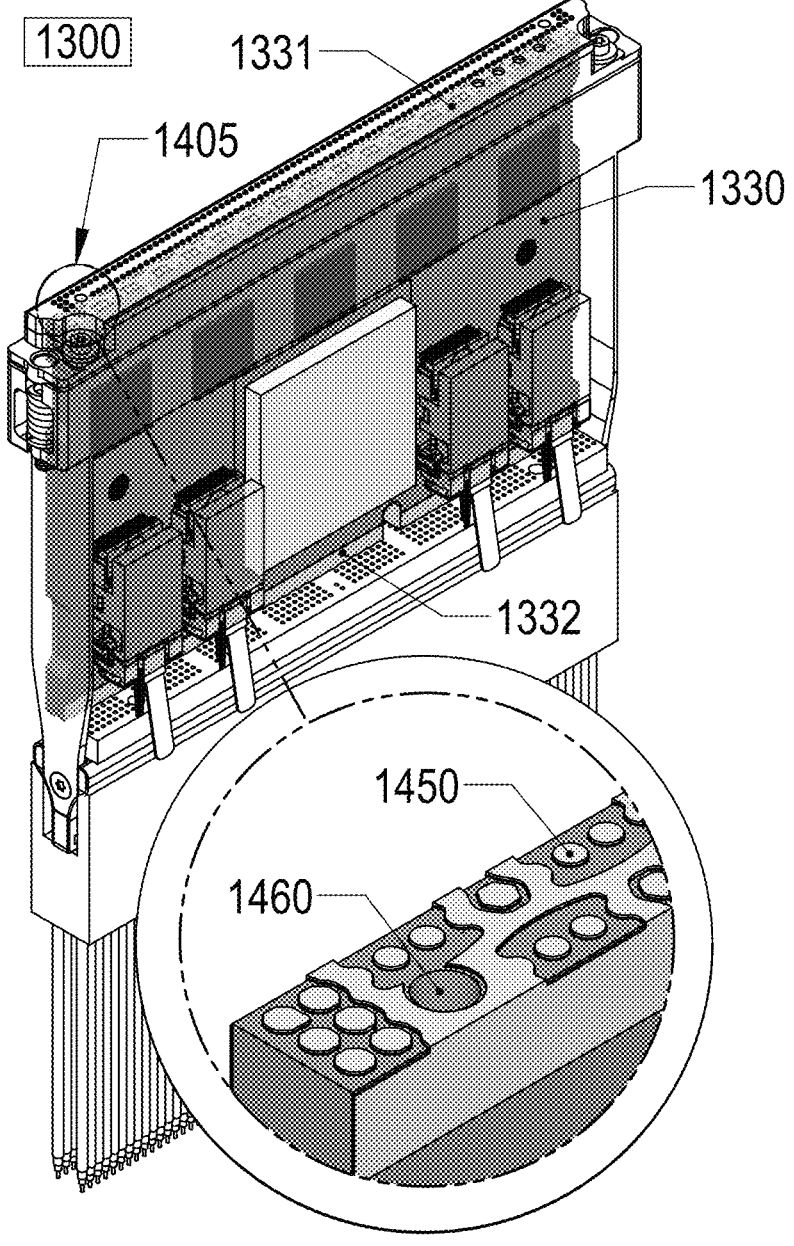
FIG. 14 is a partially transparent version of FIG. 13 showing circuit board details.

FIGS. 13 and 14 are perspective views of test instrument 1300. FIG. 13 shows major components that include mechanical structure 1310, interposer 1320, circuit board 1330, one or more processing devices such as 1335, and cable assembly 1340. Detail 1305 of interposer 1320 shows conductive interposer contacts 1350 and alignment pin 1360. In this instrument design, interposer 1320 routes signals from electrically conductive regions on the edge of circuit board 1330 so that those signals reach the intended electrically conductive regions on a DIB (not shown).

FIG. 14 shows a partially transparent view of test instrument 1300 that focus on circuit board 1330 with electrically conductive pads formed on edges 1331 and 1332. Detail 1405 of circuit board edge 1331 shows electrically conductive regions 1450 and blind alignment hole 1460. As stated previously, the electrically conductive regions 1450 may have any configuration; this example shows only one possible configuration.

Figure 15:
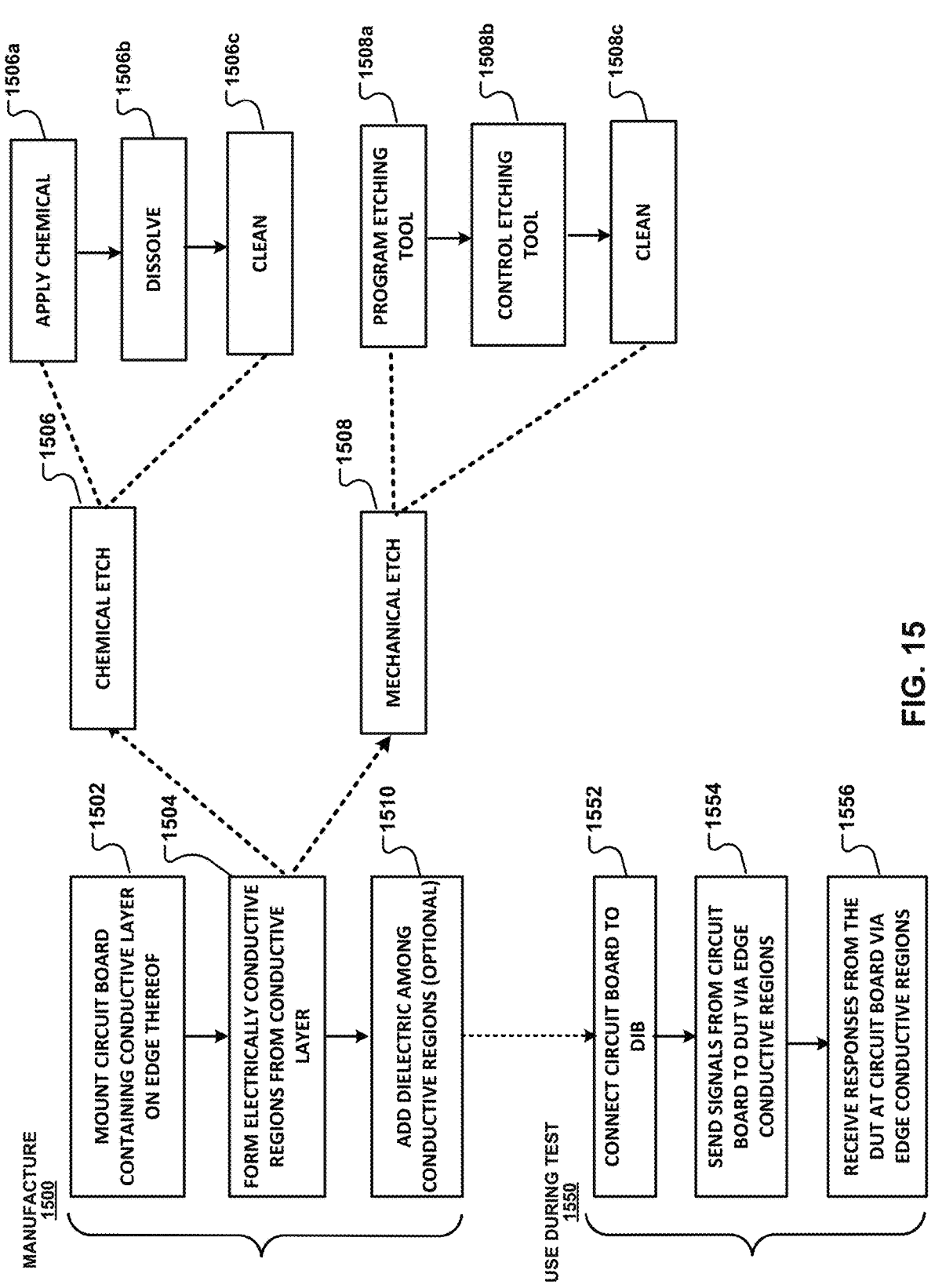
FIG. 15 is a flowchart showing example processes for manufacturing a circuit board having electrically conductive regions at its edge, and for using that circuit board in a test system.
Figures 17A, 17B:
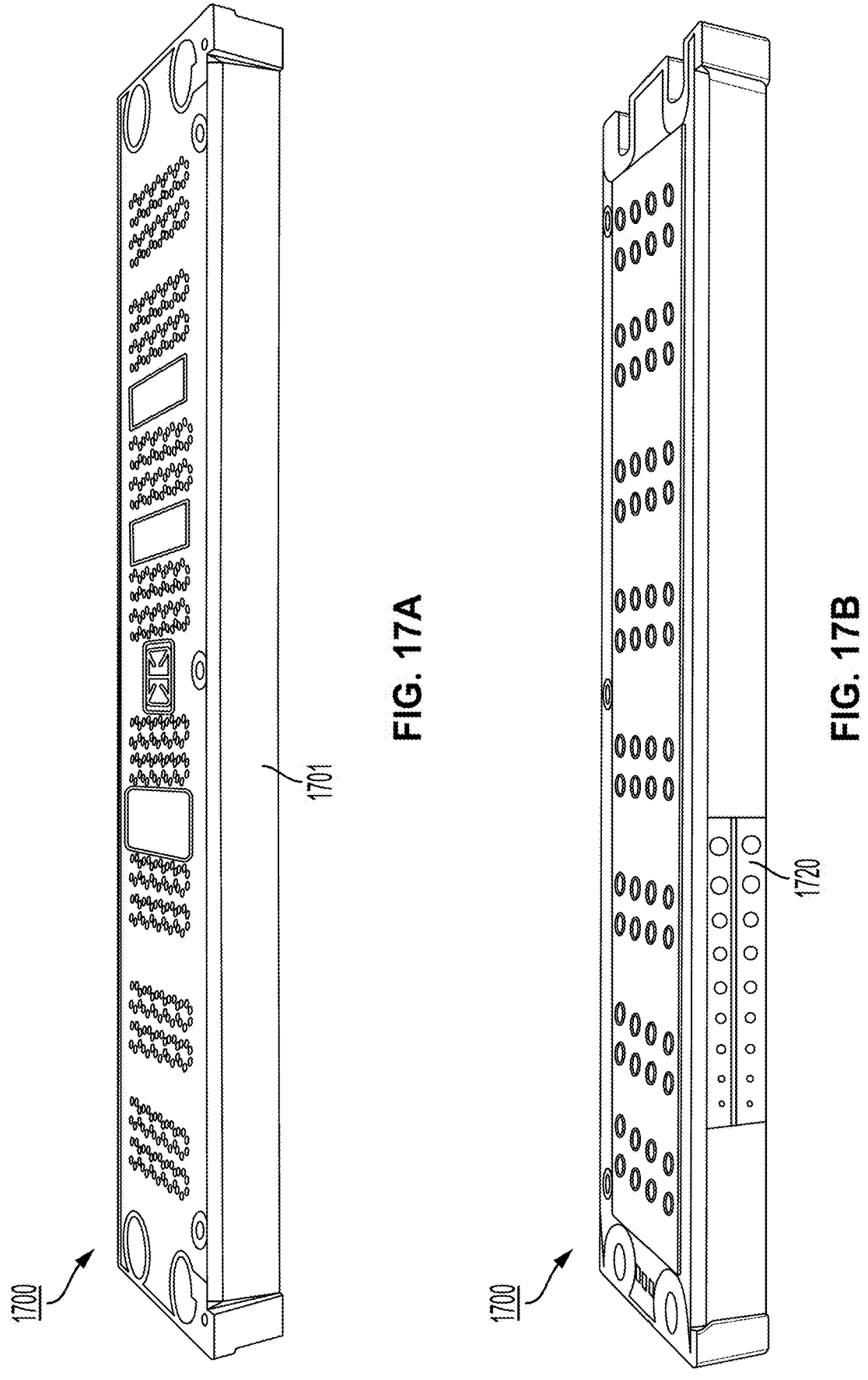
FIGS. 17A and 17B are side perspective views of an example circuit board before and after forming electrically conductive regions on its edge.

FIG. 15 shows operations included in an example process 1500 for manufacturing electrically conductive regions beginning with a circuit board having a prerequisite continuously plated edge, such as circuit board 1700 of FIG. 17A having plated edge 1701. Edge 1701 is plated with an electrically conductive material, such as copper, gold, silver, platinum, or even a combination of multiple conductive materials. The plating produces a flat surface on and along all or part of edge 1701, as shown in the figure.

According to example process 1500, circuit board 1700 is mounted (1502) to enable material removal on edge 1701. That is, the circuit board is mounted and held in place to make the plated edge accessible to manufacturing equipment.

The manufacturing equipment is configured to remove some of the conductive material from the edge. In an example, process 1500 includes the formation 1504 of electrically conductive regions on the edge 1701 of circuit board 1700. In some implementations, this may be done through chemical etching 1506 or mechanical processing 1508 including laser ablation. Other techniques not described herein may also be used to form the electrically conductive regions. The conductive material that remains— the remnants—forms a set of edge-based electrically conductive regions (e.g., 120 of FIG. 2, or as shown in FIGS. 3A, 3B, 3C, and elsewhere herein). Because the conductive regions on a particular edge were originally formed from a continuous plating, the resulting set of separated electrically conductive regions all lie substantially within the same surface and are parallel to the surface of the edge. This may be useful in situations where strict mechanical tolerances apply, such as DIB application that require a finished flatness tolerance of +/−1 mil. A mil is a measurement that equals one-thousandth of an inch, or 0.001 inch. One mil also equals 0.0254 millimeters (mm). Some example systems have a coplanar tolerance of +/−2 mils pad-to-pad or less than 1 mil for an individual pad. A coplanar tolerance refers to maximum deviation from an ideal planarity.

In some implementations, chemical etching 1506 includes application 1506*a* of one or more chemicals that dissolve the conductive material in regions of edge 1701 that are not to contain the electrically conductive regions. For example, a mask material may be applied onto the edge, with omissions in the mask corresponding to parts of the conductive material that is to be removed from the edge. The chemical(s) dissolve 1506*b* some un-masked conductive material from the edge without substantially affecting (e.g., causing dissolution of) the template or the protected material under it. The chemical(s) may be applied under appropriate conditions, such as specific ranges of temperatures, humidity, application time, or the like, to facilitate removal of the conductive material. Following chemical etching, cleaning 1506*c* may be required to remove debris, residual chemical(s) and/or mask material from the edge 1701 of the circuit board. The chemical etching process may be wholly or partially automated.

In some implementations, mechanical processing 1508 may include programming 1508*a* of a tool or a control system that controls a tool to operate on the edge of the circuit board. The programming may include, for example, specifying the size and shape of the circuit board edge, the size and location of the desired electrically conductive regions, and/or the path that the tool should follow.

Examples of mechanical processing tools that may be used include, but are not limited to, a computer numerical controlled (CNC) milling machine that rotates a structure to remove some of the electrically conductive material from the edge gradually and/or a laser that applies a laser beam to some of the electrically conductive material on the edge. The laser beam ablates some of the electrically conductive material to remove the material. The tool may be controlled, e.g., by the programming alone or in conjunction with user input to operate 1508*b* on a target edge of a circuit board (e.g., circuit board 1700 of FIG. 12A). The tool is thus controlled to follow a path to remove some of the electrically conductive material from the edge to form electrically conductive regions on the edge. The electrically conductive regions should be electrically isolated from each other on the edge to enable the tool to leave non-conductive material between individual conductive regions.

The mechanical processing 1508 may include cleaning 1508*c* the edge of the circuit board following formation of the electrically conductive regions such as those shown in FIG. 12B. For example, excess material may be removed by vacuum.

In some implementations, the chemical etching or mechanical processing may include removing some additional material from the circuit board (i.e. material beyond the undesired regions necessary to form electrically conductive pads) to form an integrated alignment registration feature. The alignment registration feature may be used to position the edge of the circuit board with other features or components in a mechanical assembly. FIG. 7 described above shows an example of alignment registration feature 108 formed on the edge of a circuit board.

Figure 16:
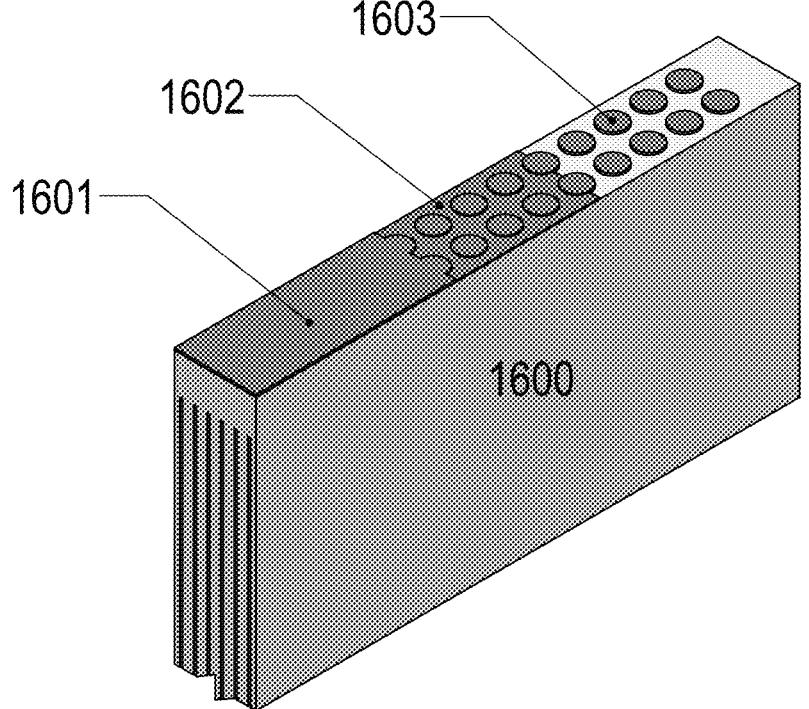
FIG. 16 is a perspective view showing a progression of manufacturing steps on the edge of a circuit board having electrically conductive regions at its edge.

FIG. 16 shows a high-level overview of the manufacturing stages. Circuit board 1600 is initially fabricated with a continuous flat conductive region 1601. Manufacturing processes incrementally remove unwanted material 1602. Finally, in this example only the desired configuration of conductive regions 1603 remain.

In implementations where the circuit board, such as that shown in FIG. 12B, is or includes a test instrument. The test instrument may be connected, either directly or indirectly, to a DIB in a test system such as that described herein, and used in the test system to test one or more DUTs connected to the DIB.

Referring back to FIG. 15, following formation 1504 of electrically conductive regions, some electrically conductive regions should be electrically isolated from each other on the edge of the circuit board. At this point, some spaces between the newly created conductive regions may be filled by adding dielectric 1510, such as those described above in the description of FIG. 8. The dielectric may function as a protective layer and an electrically isolating layer between conductive regions on the edge. A computer-controlled deposition tool may be programmed and/or controlled to add the dielectric among/between the conductive regions.

Process 1550 shows operations for using a test instrument (e.g., a circuit board having electrically conductive edge regions) in a test system. In this regard, it is noted that the manufacturing 1510 and testing 1550 processes of FIG. 15 typically will not occur near the same time, hence the dotted arrow between them. For example, the manufacturing process may be performed days, months, or years before testing.

Process 1550 includes installing the test instrument in the test system. This installation may include the connection 1552 of the test instrument to a DIB or other circuit board in a test head or elsewhere in a test system. The connection is made using the electrically conductive regions on the edge of the test instrument, so the resulting connection is at an angle such as that shown in FIGS. 1 and 9. The connection between the test instrument and the DIB may be indirect (as shown in FIG. 1 with an interposer between the two), or the connection between the test system and the DIB may be direct. In some implementations, the indirect connection may include one or more structural and/or electrical elements in addition to the interposer. For example, there may be a mechanical support assembly.

Following installation, testing may be performed. Testing includes transmission 1554 of signals from the test instrument to a DUT (e.g., by way of the DIB and, possibly, an interposer) via the electrically conductive regions on the edge of the test instrument. The signals may be high-speed signals—for example, having frequencies in the Gigahertz range—although any type of signals, including low frequency signals, may be sent. The signals may be digital, analog, or radio frequency (RF) for example.

Testing also includes reception 1556 of responses from the DUT to test instrument (e.g., by way of the DIB and, possibly, an interposer) via the electrically conductive regions on the edge of the test instrument. The test instrument may analyze the responses to determine whether the DUT has passed or failed testing or send the signals to a control system such as the one described by FIG. 18 below for analysis.

Figure 18:
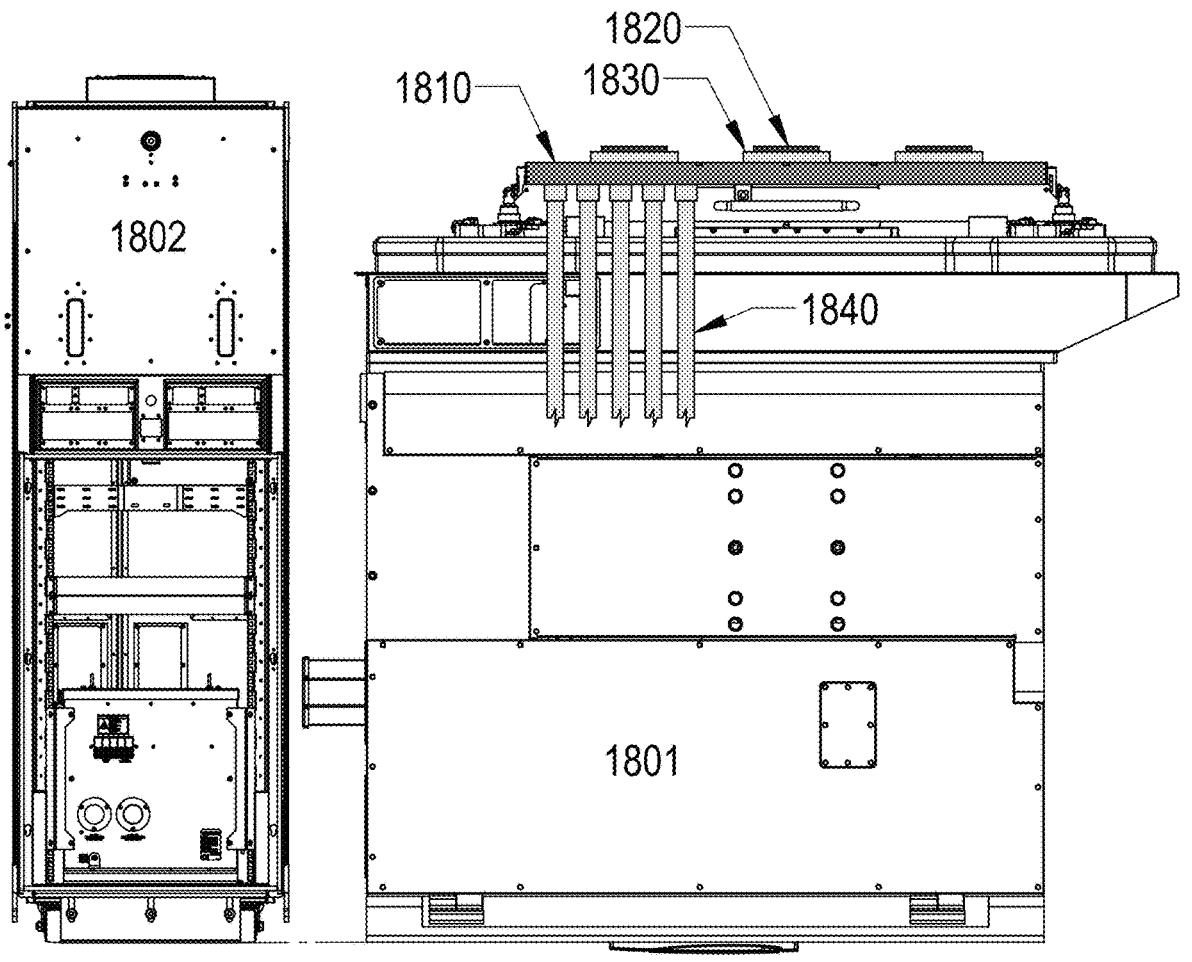
FIG. 18 is a block diagram showing components of an example test system in which the circuit boards described herein may be used.

FIG. 18 is a diagram showing components of example automatic test equipment (ATE) 1800, which is a type of test system. ATE 1800 may include a test head 1801 and a control system 1802 in some implementations. The test head 1801 may include a DIB 1810 to support one or more DUTs 1820 connected through one or more interface sites 1830. DIB 1810 may include, among other things, connectors, conductive traces, conductive layers, and circuitry for routing signals between test instruments in the test head 1801, DUTs connected to DIB sites, and other circuitry in the ATE.

Test head 1801 includes one or more test instruments such as instrument 1840, each of which may be configured, as appropriate, to implement testing and/or other functions. Some of these test instruments may incorporate electrically conductive regions on one or more edges, the construction of which has been previously shown and described.

Although only five test instruments are shown, ATE 1800 may include any appropriate number of test instruments, including one or more test instruments residing outside of test head 1801.

Control system 1802 is configured to—e.g., programmed to—communicate with test instruments such as 1840 to direct and/or to control testing of the DUTs. In some implementations, this communication may be over a computer network or via a direct connection such as a copper or optical medium. The control system may be or include a computing system comprised of one or more processing devices and memory for storage of test programs and/or test patterns that may be executed on the control system to control the test instruments or transferred to the test instruments to implement testing. The control system, alone or in conjunction with the test instruments, may determine whether a DUT has passed or failed testing.

Testing performed as described herein may be implemented using hardware or a combination of hardware and software. For example, a test system like the ones described herein may include various controllers and/or processing devices located at various points inside and/or outside test head 1801 and control system 1802. A central computer may coordinate operation among the various controllers or processing devices. Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

While this specification describes example implementations related to "testing" and a "test system," the devices and method described herein may be used in any appropriate system, and are not limited to test systems or to the example test systems described herein.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

In the description and claims provided herein, the adjectives "first", "second", "third", and the like do not designate priority or order unless context suggests otherwise. These adjectives may be used solely to differentiate the nouns that they modify.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. An apparatus comprising:
a circuit board comprising:

layers that form first electrically conductive regions and electrically non-conductive regions, the first electrically conductive regions comprising a first electrically conductive trace inside the circuit board and a second electrically conductive trace on an outer surface of the circuit board;

an edge at an angle relative to the layers;

second electrically conductive regions on the edge, the second electrically conductive regions being substantially flat and each having a connection surface that is substantially parallel to a surface of the edge;

wherein the first electrically conductive trace is electrically connected to a first one of the second electrically conductive regions; and a third electrically conductive trace on the edge of the circuit board, the third electrically conductive trace being electrically connected to a second one of the second electrically conductive regions and to the second electrically conductive trace.

2. The apparatus of claim 1, wherein the edge is at a right angle relative to the layers or at an oblique angle relative to the layers.

3. The apparatus of claim 1, wherein the second electrically conductive regions comprise remnants of an original larger electrically conductive region.

4. The apparatus of claim 1, further comprising:

a filling or a coating comprising a protective substance among the second electrically conductive regions.

5. An apparatus comprising:

a circuit board comprising:

layers that form first electrically conductive regions and electrically non-conductive regions;

an edge at an angle relative to the layers; and second electrically conductive regions on the edge, at least some of the second electrically conductive regions each being electrically connected to one or more of the first electrically conductive regions, the second electrically conductive regions being substantially flat and each having a connection surface that is substantially parallel to a surface of the edge;

wherein the circuit board comprises a test instrument or a subassembly of the test instrument.

6. The apparatus of claim 5, further comprising:

a device electrically connected to the second electrically conductive regions;

wherein the device comprises an interposer, the interposer for translating a pitch of signal paths between the second electrically conductive regions and another device connected to the interposer.

7. The apparatus of claim 6, wherein the circuit board is a first circuit board and the device comprises a second circuit board.

8. The apparatus of claim 5, further comprising:

a device electrically connected to the second electrically conductive regions;

wherein the device comprises a connector assembly, the connector assembly being configured to connect electrically to a mating connector assembly.

9. A method of processing a circuit board comprising an edge plated with electrically conductive material, the method comprising:

mounting the circuit board to enable a tool to access the edge;

controlling the tool to execute a path to remove some of the electrically conductive material from the edge to form electrically conductive regions on the edge, the electrically conductive regions being electrically isolated from each other on the edge, and the electrically conductive regions being substantially flat and each having a connection surface that is within a substantially same plane; and following removal of some of the electrically conductive material from the edge to form the electrically conductive regions, filling regions between at least some of the electrically conductive regions with a dielectric material.

10. A method of processing a circuit board comprising an edge plated with electrically conductive material, the method comprising:

mounting the circuit board to enable a tool to access the edge; and controlling the tool to execute a path to remove some of the electrically conductive material from the edge to form electrically conductive regions on the edge, the electrically conductive regions being electrically isolated from each other on the edge, and the electrically conductive regions being substantially flat and each having a connection surface that is within a substantially same plane;

wherein the tool comprises a computer numerical controlled (CNC) milling machine that rotates a structure to remove at least some of the electrically conductive material from the edge gradually.

11. The method of claim 10, wherein the CNC milling machine is configured to remove additional electrically conductive plating from the edge to form at least one mechanical alignment registration feature.

12. The method of claim 9, wherein the tool comprises a laser that applies a laser beam to at least some of the electrically conductive material on the edge, the laser beam ablating at least some of the electrically conductive material.

13. A method of processing a circuit board comprising an edge plated with electrically conductive material, the method comprising:

mounting the circuit board to enable a tool to access the edge; and controlling the tool to execute a path to remove some of the electrically conductive material from the edge to form electrically conductive regions on the edge, the electrically conductive regions being electrically isolated from each other on the edge, and the electrically conductive regions being substantially flat and each having a connection surface that is within a substantially same plane;

wherein the circuit board is part of a test instrument, the test instrument for sending test signals to a device under test (DUT) and for analyzing responses from the DUT; and wherein the method further comprises:

coupling the circuit board to a device interface board (DIB) including electrically connecting the electrically conductive regions to the DIB, the DIB comprising a contact that electrically connects to the DUT;

sending the test signals from the circuit board to the DUT via the electrically conductive regions; and receiving, at the circuit board, the responses from the DUT via the electrically conductive regions.

14. The method of claim 13, wherein coupling the circuit board to the DIB comprises:

connecting an interposer between the circuit board and the DIB, the interposer providing electrical connections between the electrically conductive regions and the DIB.

15. The method of claim 13, wherein the circuit board is coupled to the DIB at an oblique angle or a right angle.

16. A method of processing a circuit board comprising an edge plated with electrically conductive material, the method comprising:

mounting a circuit board to enable chemical etching of the edge;

performing chemical etching on the edge to remove some of the electrically conductive material from the edge to form electrically conductive regions on the edge, the electrically conductive regions being electrically isolated from each other on the edge, and the electrically conductive regions being substantially flat and each having a connection surface that is within a substantially same plane; and following removal of some of the electrically conductive material from the edge to form the electrically conductive regions, filling regions between at least some of the electrically conductive regions with a dielectric material.

17. A system comprising:

a first circuit board comprising first electrically conductive regions; and a second circuit board comprising:

layers that form second electrically conductive regions and electrically non-conductive regions, the second circuit board comprising an edge at an angle relative to the layers; and third electrically conductive regions on the edge, the third electrically conductive regions being substantially flat and each having a connection surface that is substantially parallel to a surface of the edge, the third electrically conductive regions being electrically connected to the first electrically conductive regions and to the second electrically conductive regions;

wherein the first circuit board and the second circuit board are physically coupled to each other, the second circuit board being at an oblique angle or a right angle relative to the first circuit board;

wherein the second circuit board comprises a test instrument or a subassembly of the test instrument.

18. The system of claim 17, wherein the second circuit board is at angle of between 45° and 90° inclusive relative to the first circuit board.

19. The system of claim 17, further comprising:

an interposer between the first circuit board and the second circuit board, the interposer physically coupling the first circuit board and the second board.

20. A system comprising:

a first circuit board comprising first electrically conductive regions; and a second circuit board comprising:

layers that form second electrically conductive regions and electrically non-conductive regions, the second circuit board comprising an edge at an angle relative to the layers; and third electrically conductive regions on the edge, the third electrically conductive regions being substantially flat and each having a connection surface that is substantially parallel to the edge surface, the third electrically conductive regions being electrically connected to the first electrically conductive regions and to the second electrically conductive regions;

wherein the first circuit board and the second circuit board are physically coupled to each other, the second circuit board being at an oblique angle or a right angle relative to the first circuit board;

wherein the first circuit board comprises a device interface board (DIB), the DIB being configured to hold a device under test (DUT);

wherein the system further comprises a test instrument comprising the second circuit board, the test instrument being configured to perform operations comprising:

sending test signals to the DUT via the third electrically conductive regions;

receiving responses from the DUT via the third electrically conductive regions; and analyzing the responses to determine whether the DUT passed or failed testing.

* * * * *